United States Patent [19]

Craycraft et al.

[11] 4,271,487
[45] Jun. 2, 1981

[54] STATIC VOLATILE/NON-VOLATILE RAM CELL

[75] Inventors: Donald G. Craycraft, Spring Valley; George C. Lockwood, Dayton; Darrel D. Donaldson, Kettering, all of Ohio

[73] Assignee: NCR Corporation, Dayton, Ohio

[21] Appl. No.: 93,780

[22] Filed: Nov. 13, 1979

[51] Int. Cl.³ ............................................. G11C 11/40
[52] U.S. Cl. ..................................... 365/189; 365/78; 365/182; 365/184; 365/222; 307/238.3
[58] Field of Search ................. 365/78, 182, 184, 189; 307/238, 200 B, 219, 354, 355

[56] References Cited

U.S. PATENT DOCUMENTS 3,950,737  4/1976  Uchida et al. ......................... 365/78

Primary Examiner—Terrell W. Fears
Attorney, Agent, or Firm—J. T. Cavender; Philip A. Dalton; Lowell C. Bergstedt

[57] ABSTRACT

A volatile/non-volatile RAM cell employing a bistable multivibrator with non-volatile, alterable-threshold capacitors coupled to the output terminals thereof to provide backup data storage in a power-down situation. In one embodiment, the non-volatile capacitors each have a non-alterable section and an alterable section, the non-alterable section having either a depletion or an enhancement threshold. The V/NV RAM cell employs a pair of field effect transistors of depletion or enhancement type to couple the non-volatile capacitors to the output terminals. These coupling transistors form with the non-volatile capacitors a pair of nodes. The coupling transistors are biased such that a write voltage signal applied to the gates of the non-volatile capacitors produces a bootstrapped voltage on one of the pair of nodes which is effectively isolated from the output terminals of the cell.

6 Claims, 5 Drawing Figures

STATIC VOLATILE/NON-VOLATILE RAM CELL

BACKGROUND OF THE INVENTION

This invention generally relates to semiconductor memory devices and more specifically to static random access memory systems having both volatile and nonvolative binary data storage capability. Semiconductor memories generally fall into three categories: read only memory (ROM), random access memory (RAM), and serial access memory (SAM).

A ROM is typically employed where a fixed bit pattern is required, such as for a firmware or microcode program in a computer system. However, within the general category of ROMs there are programmable read only memories (PROMs), erasable PROMs (EPROMs) and electrically-alterable read only memories (EAROMs) which are sometimes designated electrically erasable PROMs (EEPROMs). PROMs have the characteristic that they can be written one time only to a selected bit pattern which thereafter becomes fixed. EPROMs can be electrically programmed to a preselected bit pattern, but they typically require ultraviolet light shined on the device to erase the stored bit pattern. This usually requires the EPROM device to be removed from the circuit in which it is used. EEPROMs can be electrically erased and reprogrammed in the circuit environment in which they are being used. While both EPROMs EEPROMs have the capability of altering the bit pattern stored therein, the substantial time required for erasing and re-programming precludes their use as random access memory devices in memory systems which require very rapid changing of some or all of the stored bit pattern.

Semiconductor SAM devices generally fall into the charge-coupled device memory (CCDM) or bubble domain memory (BDM) categories. CCDM and BDM systems typically involve single or multiple serial data loops with access to data stored at any particular location typically requiring serial shifting of each bit of data to a location where it can be accessed for reading or writing. Semiconductor SAM systems are thus typically employed where large amounts of data need to be stored but very rapid access to any particular data bit is not required.

Semiconductor RAMs generally fall into two categories: static RAMs and dynamic RAMs. Static RAMs typically employ cells comprising bistable multivibrator or flip-flop circuits with the stored bit value determined by which of its two bistable states the circuit is in. Dynamic RAMs typically employ a cell arrangement in which the stored bit value is determined by the presence or absence of a voltage stored on a semiconductor capacitor structure. Since static RAMs employ bistable devices, the bit content of each cell is retained without refreshing and the readout of the bit content is nondestructive. Dynamic RAMs on the other hand typically require periodic refreshing of the information stored on the capacitor although the readout may be either destructive or non-destructive depending on the cell design.

All versions of ROMs are inherently non-volatile, including EPROMs and EEPROMs, due either to the ROM cell design or to the electrical characteristics of the devices employed in each ROM cell. RAMs, on the other hand, are generally volatile devices, i.e., the bit content of the memory is typically lost if electric power to the RAM is removed or lost. However, over the past decade or so, various approaches have been taken to adding backup non-volatile storage capability to RAMs. The invention set forth herein falls generally into the field of RAMs in which non-volatile semiconductor memory devices are employed in each RAM cell to provide backup non-volatile data storage capability. In general, static RAM cells can be provided with nonvolatile backup data storage capability by adding non-volatile, threshold-alterable devices of the transistor or capacitor variety to the RAM cell. These cells will be referred to as volatile/non-volatile RAM cells or simply V/NV RAM cells.

V/NV RAM cells incorporating non-volatile transistors are disclosed in the following exemplary references: Mark et al. U.S. Pat. No. 3,636,530; Lockwood U.S. Pat. No. 3,676,717; an article by Frohman-Bentchkowsky, entitled "The Metal-Nitride-Oxide-Silicon (MNOS) Transistor—Characteristics and Applications", "Proceedings of the IEEE", Vol. 58, No. 8, August 1970 (Page 1218); Uchida et al. U.S. Pat. No. 3,950,737; and Uchida U.S. Pat. No. 4,044,343. V/NV RAM cells employing non-volatile transistor backup devices have been employed in non-volatile counter circuits manufactured by various companies for electronic artillery fuse applications and for other general purpose uses. They are also employed in several V/NV RAM integrated circuits (ICs) commercially available from several companies.

V/NV RAM cells using non-volatile capacitor elements are disclosed in the following exemplary prior art references: Ho et al. U.S. Pat. No. 3,662,351; copending Aneshansley U.S. application Ser. No. 947,927, filed Oct. 2, 1978, (having an effective filing date of Sept. 5, 1975, for parent application Ser. No. 610,813); Schuermeyer et al. U.S. Pat. No. 4,091,460; copending Lockwood U.S. application Ser. No. 020,124, filed Mar. 13, 1979; and Uchida et al. Japanese Disclosure No. 53-72429, published June 27, 1978.

In general, V/NV RAM cells employing non-volatile capacitors require fewer active semiconductor devices than do V/NV RAM cells employing non-volatile transistors. Since the general trend of the semiconductor industry is toward producing ICs with higher bit storage densities and since V/NV RAM cells having fewer active devices per cell occupy less "real estate" on an IC chip, it is anticipated that the trend will be toward usage of V/NV RAM cells with non-volatile capacitor devices. Another advantage of such cells is that one fewer control signal lines are required to be routed to each cell, and thus one less control signal need be provided to the IC chip. This further reduces chip real estate and eliminates one pin-out on the IC chip.

The present commercial versions of V/NV RAM ICs generally employ the RAM cell structure shown in FIG. 1 of the Uchida '343 patent (a virtually identical cell structure also being shown in FIG. 10 of the Mark et al. '530 patent). These V/NV RAM cells employ bypass transistors in parallel with the non-volatile memory transistors in the load circuits of the cell with a separate control line provided to these bypass transistors to turn them off when information is being read out of the non-volatile memory transistors and to turn them on when the cell is operating in the normal volatile mode. The bypass transistors and the control lines thereto add substantially to the "real estate" consumed by each V/NV RAM cell, and the control line further requires a separate pin-out on the IC chip.

The V/NV RAM cell disclosed in the Schuermeyer et al. '460 patent involves the smallest number of active devices of any of the prior art non-volatile RAM cells known to me. This results from using only a single pair of split-gate, non-volatile, threshold-alterable capacitors in each cell as both charge pump, low current load impedances and backup non-volatile memory devices. However, while the Schuermeyer et al. V/NV RAM cell could be manufactured with the highest number of cells per unit area of an IC chip, it requires that the charge pump line be provided with a relatively high frequency charge pump signal during normal volatile operation of the V/NV RAM Cell. Typically, V/NV RAM ICs are used in systems which employ a substantial number of such ICs to provide the total memory bit capacity required. Present n-channel SIS device technology could provide IC chips using the Schuermeyer et al. V/NV RAM cell having a total of 4,096 memory cells on each chip. Driving each chip would require a substantial AC current supply due to the relatively large total capacitance of the 8,192 alterable capacitors being driven in parallel by the high frequency charge pump signal. When multiples of such chips are employed, the total demand for AC charge pump current is multiplied by the number of chips. The Schuermeyer et al. V/NV RAM cell thus has the disadvantage of requiring that the system designer provide an AC charge pump signal of high current capacity. This special AC signal would generally not be useful in any other portion of a data processing system environment in which these types of memory chips are typically used.

FIG. 1A of the drawings herein shows a prior art V/NV RAM cell employing non-volatile capacitor structures instead of non-volatile transistor structures. It should be apparent that fewer active devices are used in this type of cell and thus the chip real estate consumed by such memory cell is substantially less. FIG. 1A is structurally equivalent to the V/NV RAM cell disclosed in FIG. 4 of the above-referenced Aneshansley application. The only difference is that a preferred split-gate, non-volatile capacitor structure is schematically depicted in FIG. 1A, whereas the more general non-volatile capacitor symbol is used in FIG. 4 of the Aneshansley application. This split gate non-volatile capacitor structure is disclosed in Chang et al. U.S. Pat. No. 3,911,464 (e.g. FIGS. 9 and 10), the disclosure of which is specifically incorporated herein by reference. The structure and operation of the V/NV RAM cell disclosed in the Aneshansley application results in inversion of the data during a power-up, non-volatile/-volatile restore operation (hereinafter simply called a "NV/V restore operation"). Those skilled in the semiconductor art will appreciate that, if the prior art N/NV RAM cell shown in FIG. 1A were implemented in a straightforward manner in a five volt, n-channel, semiconductor-insulator-semiconductor (SIS) device technology, the enhancement load transistors would be changed to high semiconductor resistors or high impedance depletion mode devices to reduce the power consumption of the cell. However, this straightforward adaptation to this currently highest state of the art technology would result in a marginal differential voltage threshold window between the two non-volatile capacitors after a power-down, volatile/non-volatile write operation (hereinafter simply called a "V/NV write operation"). This results because the five volt signal on one of output nodes does not provide effective channel shielding in one of the non-volatile capacitors during the V/NV write operation. This is explained in more detail below.

FIG. 1B of the drawings herein shows a prior art V/NV RAM cell which employs non-volatile capacitor structures and utilizes both a semiconductor resistance element and a field effect transistor of the enhancement type in the load circuit of the multivibrator. FIG. 1B is disclosed in the above-referenced Lockwood application and constitutes an improvement over the cell disclosed in the above-referenced Aneshansley application in that the utilization of the enhancement type field effect transistor in the load circuits of the multivibrator provides a bootstrapped voltage on one of the output nodes during a V/NV write operation to provide a more effective channel shielding voltage to one of the non-volatile capacitors. However, the presence of the bootstrapped voltage on one of the output nodes of the multivibrator circuit requires that the switching transistors in the multivibrator be constructed with relatively long channel lengths to handle the bootstrapped voltage magnitude. Accordingly, these switching transistors occupy a substantial amount of chip real estate.

The V/NV RAM cell disclosed in the above-referenced Uchida et al. Japanese Disclosure also involves the production of a bootstrap voltage on the output nodes of the multivibrator. Consequently, that cell has the same inherent disadvantage of requiring large switching transistors to withstand the bootstrapped voltage.

SUMMARY OF THE INVENTION

The invention set forth and claimed herein comprises an improvement over the V/NV RAM cells disclosed in the above-referenced Lockwood patent application and the above-referenced Uchida et al. Japanese Disclosure. The improvement is achieved by employing a transistor between each of non-volatile capacitors in the cell and its associated output node. These coupling transistors are biased such that a bootstrapped voltage will be produced on one of a pair of nodes defined by the junctions of the non-volatile capacitors and the coupling transistors at the time a V/NV write signal is applied to the gate electrode of the non-volatile capacitors. The two coupling transistors in series with the non-volatile capacitors effectively isolate the bootstrapped voltage from the output terminals of the multivibrator. This enables the utilization of switching transistors in the multivibrator having shorter channel lengths and thus reduces the overall chip real estate consumed by the cell. Another advantage is that it allows more efficient bootstrapping because the bootstrap node is smaller and there is less charge redistribution.

More specifically, the invention comprises an improved memory cell having both volatile and non-volatile binary data storage capability. The improved memory cell comprises essentially a bistable multivibrator having selectable first and second stable volatile operating states and including a pair of output terminals having voltages thereon representing the operating state thereof and a pair of non-volatile, threshold alterable capacitors coupled to said output terminals and having gate electrodes independent of the output terminals adapted to receive write, restore and erase voltage signals. The multivibrator circuit is constructed with low supply voltage (e.g. five volt) n-channel, SIS device technology and further comprises a field effect transistor of a depletion or enhancement type coupled between each of the non-volatile capacitors and an associated output terminal to form a pair of nodes therebetween. The gates of the field effect transistors are adapted to receive a prearranged bias voltage such that, upon receipt by the gate electrodes of the non-volatile capacitors of a write voltage signal at least several times greater in magnitude than the supply voltage, the voltage on one of the pair of nodes bootstraps to a magnitude substantially greater than the supply voltage. This provides effective channel shielding in the associated non-volatile capacitor while simultaneously isolating the bootstrapped voltage from the output terminals. This isolation of the bootstrapped voltage from the multivibrator output terminals results in a higher bootstrapped voltage due to the lower capacitance associated with the second pair of nodes. Further, since the bootstrapped voltage does not appear on the output terminals of the multivibrator, the switching transistors connected thereto can be reduced in size, thereby reducing the chip real estate consumed by each memory cell. As an example, a V/NV RAM cell laid out in accordance with the above-referenced Lockwood application consumed a chip area of five square mils whereas a corresponding V/NV RAM cell in accordance with the circuit of this invention occupied a chip area of about three square mils. In addition the V/NV RAM cell according to this invention eliminates any possible problem of data loss due to a leaky junction associated with the output terminals. If the voltage on the output terminal bootstraps during a V/NV write operation, a leaky junction associated therewith may dissipate the voltage and result in an ineffective V/NV write with consequent loss of information. The isolation of the output terminals from the bootstrapped voltage eliminates this problem.

Other features and advantages of the invention will be apparent from a consideration of the detailed description below in conjunction with the accompanying drawings.

DESCRIPTION OF THE PREFERRED EMBODIMENT

As background for considering the structure and operation of the V/NV RAM in accordance with this invention, it will be helpful to just consider in some detail the structure and operation of prior art cells.

Figure 1A:
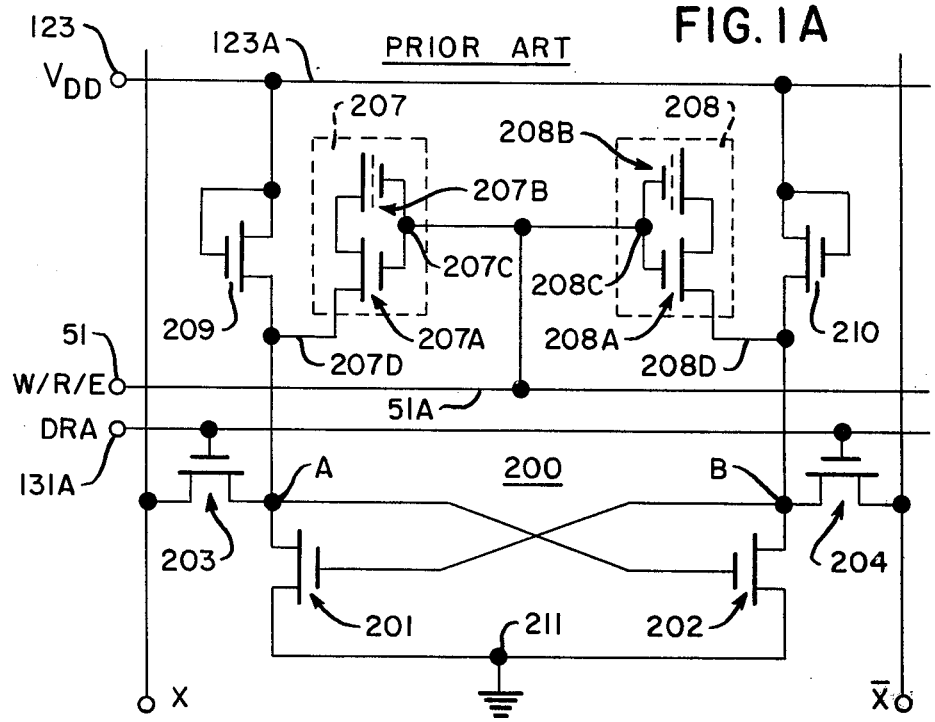
FIG. 1A is a circuit schematic diagram of a V/NV RAM cell of the prior art type disclosed in the above-referenced Aneshansley patent application.

FIG. 1A depicts a V/NV RAM cell 200 generally in accordance with the prior art as represented by the above-referenced Aneshansely patent application. In particular, the V/NV RAM cell 200 depicted in FIG. 1A is essentially the same as the V/NV RAM cell shown in FIG. 4 of the Aneshansley application. This prior art V/NV RAM cell comprises essentially a bistable multivibrator (or flip-flop) circuit arrangement which has selectable first and second stable, volatile operating states. Output terminals A and B have voltages thereon which represent the operating state of the multivibrator. A pair of cross-coupled field effect transistors 201 and 202 are connected between output terminals A and B and a reference voltage terminal 211, shown connected to a ground reference potential. A pair of enhancement mode load transistors 209 and 210 are coupled between respective output terminals A and B and a power supply bus 123A. The multivibrator further employs a pair of non-volatile, threshold-alterable capacitors 207 and 208 connected, respectively, to output terminals A and B via lines 207D and 208D. Non-volatile capacitors 207 and 208 have gate electrodes 207C and 208C, respectively, which are independent of output terminals A and B and are connected to a control terminal 51 over a control line 51A. Control terminal 51 is also designated W/R/E to indicate that control terminal 51 is selectively provided with Write, Restore, and Erase voltage signals during a sequency of V/NV write, NV/V restore, and erase operations on cell 200. Field-effect transistor 203 is connected between output terminal A and column data line X. Field-effect transistor 204 is connected between output terminal B and the column data line $\overline{X}$. The gates of transistors 203 and 204 are connected to a row address line 131A which is also denoted DRA, signifying Decoded Row Address signal. Transistors 203 and 204 are commonly called access transistors. Complementary column data lines X and $\overline{X}$ are typically connected to the power supply voltage through load devices (not shown).

Except for the presence of non-volatile capacitors 207 and 208, V/NV RAM cell 200 is a standard static RAM cell and functions in the typical data write, read and storage modes of such a cell. The volatile operation of such a static RAM cell is well-known to those of skill in the semiconductor memory art and only a brief background discussion of this operation will be given here. RAM cell 200 has two stable, volatile operating states. In the first of these volatile operating states, switching transistor 201 is on and switching transistor 202 is off. For convenience, this will be hereafter termed a "volatile 0 state" corresponding to a stored 0 bit. Accordingly, the voltage on output terminal A is essentially ground reference potential since transistor 201 is designed to have a very low impedance in its on state. Contrastingly, output terminal B has a voltage thereon substantially equal to the power supply voltage on bus 123A less the voltage drop across load transistor 210. The second stable volatile operating state exists when transistor 201 is off and transistor 202 is on. For convenience, this will be called the "volatile 1 state" corresponding to a stored 1 bit. In the volatile 1 state, the voltages on output terminals A and B are reversed, i.e., the voltage on output terminal A is at a positive voltage and the output terminal B is at ground reference potential.

Access transistors 203 and 204 are employed to write binary data into RAM cell 200 and to read out binary data from the cell. In a write data operation, access transistors 203 and 204 are turned on to enable voltages provided on complementary column data lines X and $\overline{X}$ to be coupled to output terminals A and B, respectively. If RAM cell 200 is to be written into a volatile 0 state, column data line X will be provided with a ground reference signal and column data line X̄ will be provided with a voltage of about the same magnitude as the power supply voltage on bus 123A. These voltages on the complementary column data lines are coupled through the access transistors 203 and 204 when a DRA (Decoded Row Address) signal is provided to line 131A. Once these voltages are coupled to output terminals A and B, the bistable multivibrator will be written into the volatile 0 state regardless of its previous state.

Correspondingly, to write RAM cell 200 into a volatile 1 state, column data line X is provided with a voltage generally corresponding to the power supply voltage and column data line X̄ is provided with a ground reference potential. These voltages coupled through access transistors 203 and 204 will cause the bistable multivibrator to assume the volatile 1 state regardless of its prior state. Once RAM cell 200 has been written into a particular one of its stable, volatile operating states, access transistors 203 and 204 are turned off. The cell retains the binary digit value (bit value) associated with that written operating state as long as electric power is provided to the cell. To read data out of the cell after it has been written in, access transistors 203 and 204 are turned on to couple whatever voltages appear on output terminals A and B to complementary column data lines X and X̄, respectively.

As is well-known, the multivibrator circuit in V/NV RAM cell 200 will not retain the stored information once power to the cell is removed or lost. While there is some capacitance associated with output terminals A and B which retains the voltages thereon for a short period of time, any power outage of substantial duration will result in a dissipation of those voltages and loss of stored information. Then when power is returned to the cell, it will assume a particular one of its operating states depending on the relative capacitive imbalance between the two halves of the cell regardless of the operating state of the cell upon power down. This operating state may or may not be the same state the cell was in at the time power was lost.

In accordance with the teachings of the above-referenced Aneshansley patent application, non-volatile capacitors 207 and 208 in V/NV RAM cell 200 enable the bit stored in the volatile 1 or 0 state of the multivibrator to be written into the non-volatile capacitors 207 and 208 in a V/NV write operation prior to loss of power to the cell. Once the bit has been written into non-volatile capacitors 207 and 208, it is retained therein until power is restored to the cell. Thereafter, the non-volatilely stored bit can be restored to the multivibrator in a NV/V restore operation. After the NV/V restore operation is performed, the non-volatile capacitors 207 and 208 may be erased with an erase voltage signal on control line 51A to prepare them for the next V/NV write operation. Alternatively, the stored information in non-volatile capacitors 207 and 208 may be retained during power-up operation and erased just prior to a power-down V/NV write operation.

The threshold-alterable portions 207B and 208B of non-volatile capacitors 207 and 208 typically require write and erase voltages of a magnitude on the order of twenty or twenty-five volts. In the case of p-channel device technology, the write voltage is a negative voltage and the erase voltage is a positive voltage. In p-channel technology non-alterable sections 207A and 208A typically have an enhancement voltage threshold of about two volts negative. Alterable sections 207B and 208B typically have an erased depletion threshold of about two volts positive and a written enhancement voltage of about eight volts negative.

A p-channel version of V/NV RAM cell 200 would typically employ negative power supply voltages on power supply bus 123A of sufficient magnitude (e.g. fifteen to twenty volts) to provide an effective channel-shielding voltage to one of the non-volatile capacitors 207 and 208 which is to be retained essentially in its erased threshold state. In other words, in a p-channel version of V/NV RAM cell 200, one of the output terminals A and B will have thereon a voltage substantially equal to the negative power supply voltage. Consider the case in which the V/NV RAM cell 200 is in a volatile 0 state with transistor 201 ON and transistor 202 OFF. In this state, output terminal B will have a voltage thereon substantially equal to the negative power supply voltage. This voltage on output terminal B is coupled via line 208D to the channel of non-volatile capacitor 208 where it provides an effective channel-shielding voltage to preclude substantial alteration of the threshold of alterable capacitor portion 208B when a write voltage of, for example, negative twenty-five volts is applied to gate electrode 208C. In other words, the signal on terminal B (e.g. twenty volts) will be coupled to the channel of alterable section 208B so that the negative twenty-five volt signal on gate electrode 208C will produce only a five volt drop across the capacitor 208 which is insufficient to substantially alter the threshold of the alterable section 208B thereof. The output terminal A has substantially ground reference potential thereon. Thus the negative twenty-five volt write signal on gate electrode 207C of non-volatile capacitor 207 produces a twenty-five volt signal across capacitor 207 which is sufficient to place alterable section 207B into its written threshold state. Consequently, the write voltage pulse will cause non-volatile capacitor 207 to be written to a high negative threshold while non-volatile capacitor 208 will have its alterable section 208B either remaining in an erased threshold state (i.e. a positive threshold voltage) or, at worst, a partly-written state with a very low negative threshold voltage (i.e. less than negative two volts). In any event, the threshold voltage differential between alterable sections 207B and 208B will be quite substantial after a V/NV write operation.

Once differential writing of non-volatile capacitors 207 and 208 has been accomplished, the volatile bit stored in cell 200 becomes a stored non-volatile bit. The stored non-volatile bit can be restored reliably to the multivibrator in a NV/V restore operation. In accordance with the teachings of the prior art Aneshansley application referred to above, the following NV/V restore operation can be implemented. First, the V/NV RAM cell output terminals A and B are precharged to ground reference potential via complementary column data linex X and X̄ and access transistors 203 and 204. Power supply line 123A is at about twenty volts negative. Then access transistors 203 and 204 are turned off and a restore signal of about six volts negative is applied on control line 51A. This negative signal will turn on both sections 208A and 208B of non-volatile capacitor 208 and only the non-alterable section 207A of capacitor 207. Thus, at that time a larger capacitance will be effectively coupled to terminal B than to terminal A. Accordingly, the voltage on terminal A will ramp towards the negative power supply voltage on power supply bus 123A more quickly than the voltage on terminal B and transistor 202 will turn on before transistor 201. Regenerative action will then cause transistor 201 to remain off and transistor 202 to saturate. This restores the binary information stored in non-volatile capacitors 207 and 208 into the volatile multivibrator section of V/NV RAM cell 200 in an inverted fashion.

With the information restored to the volatile multivibrator portion of V/NV RAM cell 200, an erase pulse can be supplied to control line 51A (e.g. a positive twenty-five volt signal) to return both alterable threshold sections 207B and 208B of non-volatile capacitors 207 and 208 to an erased threshold state. From this brief explanation, it can be seen that the V/NV RAM cell 200 can readily be implemented in p-channel device technology and will operate reliably with the typical power supply and write, restore and erase signals utilized with p-channel device technology.

The principal thrust of current semiconductor technology is toward the employment of p-channel, SIS device technology utilizing a single positive power supply voltage of substantially five volts or less to achieve high density, fast access, low power consumption IC's. Straightforward adaptation of RAM cell 200 to five volt, n-channel SIS device technology would involve substitution of either low current depletion mode transistors or, preferably, high resistance value semiconductor resistors for enhancement mode transistors 209 and 210 to achieve low current cell operation. However, with this straightforward substitution, the five volt signal on one of the output terminals A or B (depending on the state of the multivibrator) is not sufficient to provide effective channel shielding in the associated non-volatile capacitor.

Consider an n-channel, five volt version of V/NV RAM cell 200 with semiconductor resistors in the load circuits in place of enhancement mode transistors 209 and 210. Assume a volatile 0 state such that output terminal A is near ground reference and output terminal B is at about five volts. Assume non-alterable sections 207A and 208A of non-volatile capacitors 207 and 208 have a threshold of about two volts, either positive or negative. Also assume alterable sections 207B and 208B have an erased state threshold of about one volt negative and a written state threshold of about six volts positive.

During a V/NV write operation, a positive twenty volt signal is applied to gate electrodes 207C and 208C of non-volatile capacitors 207 and 208. The five volt signal on output terminal B is coupled via line 208D to the channel of the non-volatile capacitor 208. With a positive twenty volt write signal on gate electrode 208C of non-volatile capacitor 208, the voltage difference of approximately fifteen volts across the device is sufficient to write alterable section 208B to a fairly substantial positive threshold—perhaps as much as four volts positive. The difference between the twenty volt signal on gate electrode 207C and the grounded channel of non-volatile capacitor 207 associated with output terminal A is twenty volts. This twenty volt potential difference writes the alterable section 207B of non-volatile capacitor 207 to a written state threshold of about six volts positive. In best case conditions this two volt differential threshold voltage window may be sufficient to enable reliable NV/V restore operation of the cell in some restore modes. However, given the typical tolerances on IC design and process parameters and the fact that the non-volatile capacitors have different written thresholds at different temperatures and may have different degradation rates under write/erase cycling, the differences in writing thresholds between a fifteen volt write and a twenty volt write may not be sufficient to provide reliable NV/V restore operation of the cell over the required operating life of the IC device in which it is incorporated. In other words, a cell which functions with sufficient margins when the IC device in which it resides is unexercised might begin to malfunction after the device has been exercised for a relatively long period of time and a relatively large number of V/NV write, NV/V restore, and erase cycles have been performed on one or more of the cells. Therefore, it is believed that a straightforward adaptation of the prior art V/NV RAM cell depicted in FIG. 1A may not provide a reliable design for a five volt, n-channel SIS device version of a V/NV RAM system.

Figure 1B:
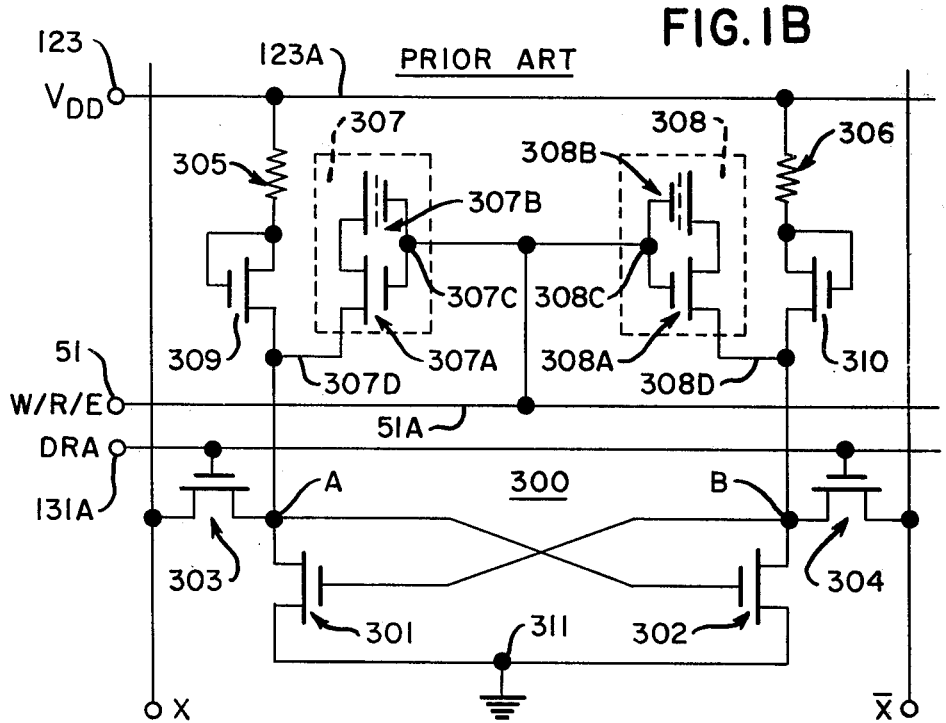
FIG. 1B is a circuit schematic diagram of a V/NV RAM cell of the prior art type disclosed in the above-referenced Lockwood patent application.

FIG. 1B depicts a V/NV RAM cell 300 generally in accordance with the prior art represented by the above-referenced Lockwood patent application. The structure of prior art V/NV RAM cell 300 differs from that of the prior art V/NV RAM cell 200 shown in FIG. 1A in that both enhancement mode field effect transistors 309 and 310 and polysilicon resistive load devices 305 and 306 are employed in the load circuits of the multivibrator. (The 300 series reference numerals in FIG. 1B correspond to the 200 series reference numerals in FIG. 1A.) The volatile operation of V/NV RAM cell 300 is virtually identical to the volatile operation of V/NV RAM cell 200 and will not be repeated here.

Incorporating enhancement mode load transistors 309 and 310 with polysilicon resistors 305 and 306 in V/NV cell 300 enables cell 300 to be reliably implemented in five volt, n-channel, SIS device technology due to an improvement in the V/NV write operation of V/NV RAM cell 300. Consider V/NV RAM cell to be in its second bistable state with switching transistor 301 off and switching transistor 302 on. In this state, output terminal A has a voltage thereon of approximately three and one-half volts positive and output terminal B has substantially ground reference potential thereon. In a V/NV write operation, a positive write voltage signal is applied to control line 51A and thus to gate electrode 307C and 308C of non-volatile capacitors 307 and 308. Upon application of a positive twenty volt write signal to control line 51A, non-volatile capacitor 307 will capacitively couple this signal to output terminal A. Cell 300 is preferably designed such that the capacitance to ground at each output terminal A and B is equal to the total capacitance of non-volatile capacitors 307 and 308 in an erased state. Typical capacitance values for each would be about 50-60 fF (femtofarads). Due to this capacitance voltage division, the signal on output terminal A will be bootstrapped to a positive voltage of approximately thirteen volts, due to the back-biased diode provided by transistor 309 enabling the voltage on terminal A to rise above the five volt supply on bus 123A. Output terminal B will, of course, remain at ground reference potential.

The bootstrapped voltage on output terminal A provides effective channel-shielding in the channel of non-volatile capacitor 307 during the V/NV write operation. Non-volatile capacitor 307 will have only a six and one-half volt signal differential between its gate electrode and the channel of threshold-alterable section 307B. This voltage differential will, at most, slightly raise the threshold voltage of alterable section 307B from its erased threshold of one volt negative. On the other hand, the twenty volt differential between gate electrode 308C and the channel of alterable section 308B of non-volatile capacitor 308 will write alterable section 308B to a threshold voltage of about six volts positive. The bootstrap voltage on output terminal A thus insures a substantial differential threshold window between alterable section 307B of non-volatile capacitor 307 and alterable section 308B of non-volatile capacitor 308. This substantial differential threshold window provides for a reliable NV/V restore operation of cell 300. V/NV cell 300 can thus readily be implemented in a five volt, n-channel, SIS device technology to produce a V/NV RAM system having reliable non-volatile backup data storage capability under power-down conditions.

Figure 2:
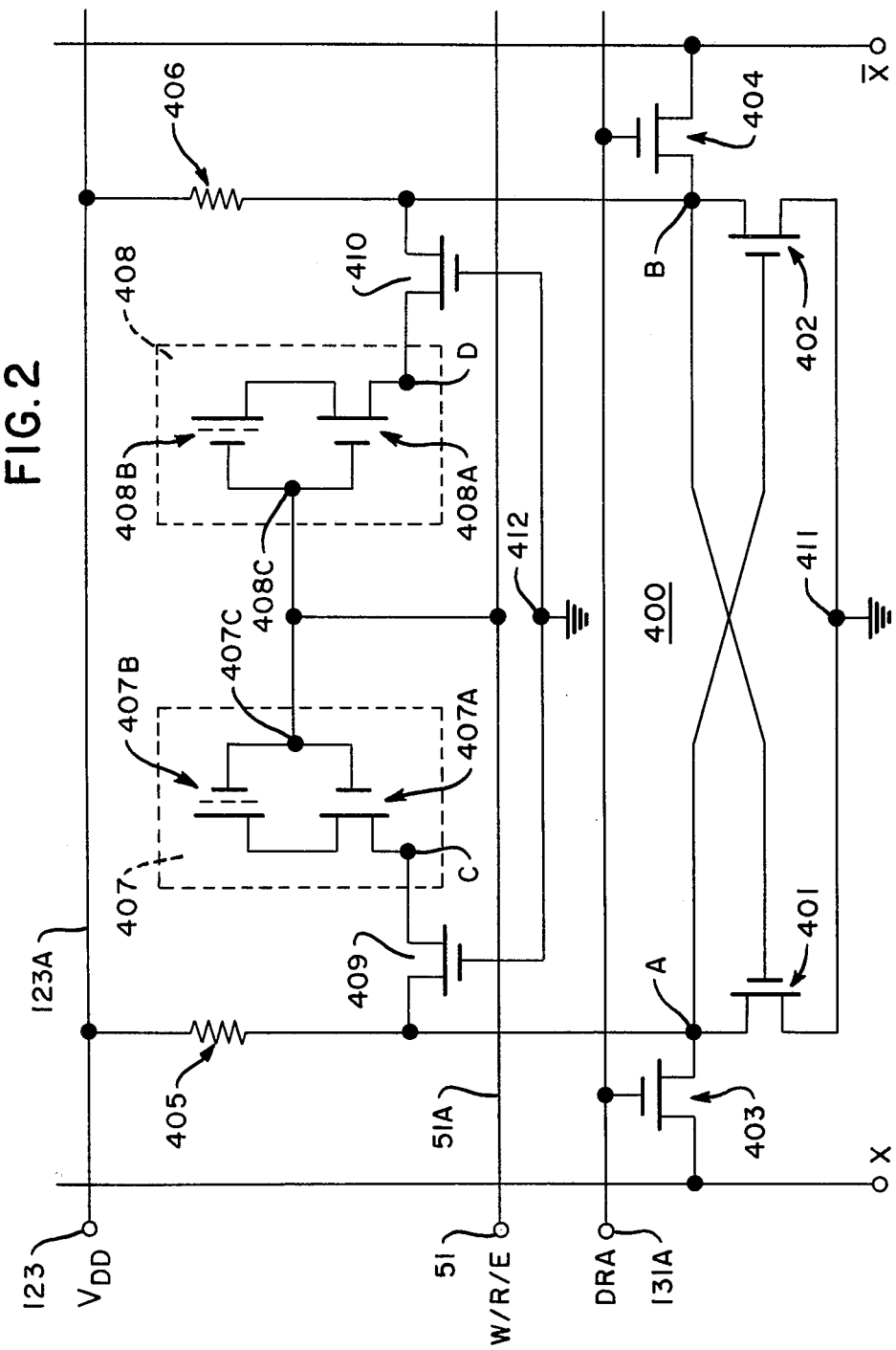
FIG. 2 is a circuit schematic diagram of a preferred embodiment of a V/NV RAM cell in accordance with this invention.

FIG. 2 depicts an improved V/NV RAM cell 400 in accordance with this invention. The structure of V/NV RAM cell 400 differs from that of the prior art cell 300 shown in FIG. 1B in that the enhancement mode field effect transistors 309 and 310 are deleted and field effect transistors 409 and 410 are inserted between output terminals A and B and non-volatile capacitors 407 and 408, respectively. Non-alterable sections 407A and 408A of capacitors 407 and 408 are not needed for the operation of cell 400. However, the inclusion of non-alterable sections 407A and 408A is preferred when using double layer polysilicon gate technology. Here, the thicker gate oxide of sections 407A and 408A provides separation between the first level polysilicon gates of transistors 409 and 410 and the polysilicon gates of capacitors 407 and 408. In all other respects the cell 400 is identical with the cell 300. The volatile operation of V/NV RAM cell 400 is identical to the volatile operation of V/NV RAM cell 200 shown in FIG. 1 and described above. Accordingly, that operation will not be repeated here.

Field effect transistors 409 and 410 are employed in cell 400 to couple non-volatile capacitors 407 and 408 to output terminals A and B respectively. Node C is formed at the junction of transistor 409 and non-volatile capacitor 407. Node D is formed at the junction of transistor 410 and non-volatile capacitor 408.

In the preferred embodiment of this invention depicted in FIG. 2 the transistors 409 and 410 are depletion mode devices and the gate electrodes thereof are connected to a common bias terminal 412 supplied with a ground reference potential. (Enhancement mode devices gate electrodes connected to the $V_{DD}$ potential could also be employed.) In an exemplary embodiment depletion mode transistors 409 and 410 have a threshold voltage of about three volts negative.

By employing depletion mode transistors 409 and 410 in the cell location shown in FIG. 2 and biasing them as shown, the nodes C and D in cell 400 become bootstrap voltage nodes during the V/NV write operation rather than the output terminals A and B as in cell 300 shown in FIG. 1B. This can be seen from a consideration of the response of cell 400 to a V/NV write voltage applied to terminal 51. Consider the V/NV RAM cell 400 to be in its second bistable state (a volatile 1 state) with switching transistor 401 off and switching transistor 402 on. In this state, output terminal A has a voltage thereon of approximately five volts and output terminal B has substantially ground reference potential thereon. In a V/NV write operation, a positive twenty volt write signal is supplied to control line 51A and thus to gate electrode 407C and 408C of non-volatile capacitors 407 and 408. Consider first depletion load transistor 410 just prior to the application of the twenty volt positive write signal to control line 51A. With its gate electrode grounded via terminal 412 and with ground reference on output terminal B, transistor 410 is biased such that, in effect, the voltage on output terminal B is the source voltage. Since the gate of transistor 410 is grounded and output terminal B is at zero volts, the gate-to-source potential differential is zero volts and transistor 410 is on. Accordingly, node D is at substantially ground reference potential. When a positive twenty volt write signal is applied to terminal 51 and coupled over line 51A to gate electrode 408C of non-volatile capacitor 408, this twenty volt signal is coupled through non-volatile capacitor 408 to node D. However, node D being at ground reference potential and transistor 410 being on, that signal is effectively grounded out and there is no change in the voltage at node D. Consequently, non-volatile capacitor 408 has a substantially twenty volt potential drop between its gate electrode and the channel region. This twenty volt potential drop between the gate and the substrate (channel) is sufficient to write the alterable section 408B of non-volatile capacitor 408 to a written state threshold of about six volts positive.

Consider now the initial state of transistor 409 prior to applying the write signal to terminal 51. With a voltage of substantially five volts at output terminal A and ground reference supplied via terminal 412 to the gate of transistor 409, transistor 409 operates as a source follower. In other words, the voltage on output terminal A is effectively the drain voltage and the voltage on node C is effectively the source voltage. Since transistor 409 is a depletion transistor with a threshold voltage established at about three volts negative, transistor 409 will be off whenever the voltage difference between its gate and source (node C) is less than three volts. With its gate electrode grounded, this means that transistor 409 will be off whenever the voltage on node C is greater than three volts positive. Operating as a source follower, without any signal applied to gate electrode 407C of non-volatile capacitor 407, node C will be sitting at substantially three volts positive established by the negative three volt depletion threshold of the transistor 409. Under these conditions, transistor 409 is off but on the verge of conduction. If a negative going signal were applied to node C, transistor 409 would turn on. However, when a positive write signal of twenty volts is applied via terminal 51 and lead 51A to gate electrode 407C of non-volatile transistor 407, this positive twenty volts signal is capacitively coupled to node C. With some capacitive voltage division due to the presence of residual capacitance at node C, node C will be driven more positively and this will immediately turn off transistor 409.

With transistor 409 off, node C bootstraps to a voltage about fifteen volts. This fifteen volt signal thus appears on the channel of alterable section 407B of non-volatile capacitor 407. With about fifteen volts in the channel region of the substrate and twenty volts on the gate electrode of non-volatile capacitor 407, effective channel shielding against writing the alterable section 407B is provided. In other words, the voltage differential across the gate insulator is insufficient to cause any substantial alteration of the threshold voltage. Alterable section 407B thus remains substantially at its erased state threshold of about one volt negative.

To summarize then, in response to a positive twenty volt write signal on terminal 51, the voltage on node C associated with transistor 409 and non-volatile capacitor 407 bootstraps to about fifteen volts positive to provide effective channel shielding against writing of the alterable section 407B of non-volatile capacitor 407. However, this positive twenty volt signal produces an effective writing of alterable section 408B in volatile capacitor 408 since node D is maintained at ground reference and no channel shielding voltage is present. Thus in response to the twenty volt positive write signal, there will be approximately seven volts differential in the thresholds of alterable sections 407B and 408B of non-volatile capacitors 407 and 408. This threshold voltage differential is sufficient to provide reliable restoration of information from the non-volatile capacitors to RAM cell 400 during a NV/V restore operation. This restore operation can be any of the restore modes disclosed in the prior art references, including the inverted and non-inverted restore modes taught in the above-referenced Lockwood application. V/NV RAM cell 400 can thus readily be implemented in five volt, n-channel, SIS device technology to produce a V/NV RAM system having reliable non-volatile backup storage capability under power-down conditions. Furthermore, since the boostrapped channel shielding voltage appears only on one of nodes C or D are not on output terminals A and B, switching transistors 401 and 402 can be made substantially smaller. A corresponding reduction in cell area is realized.

Figure 3:
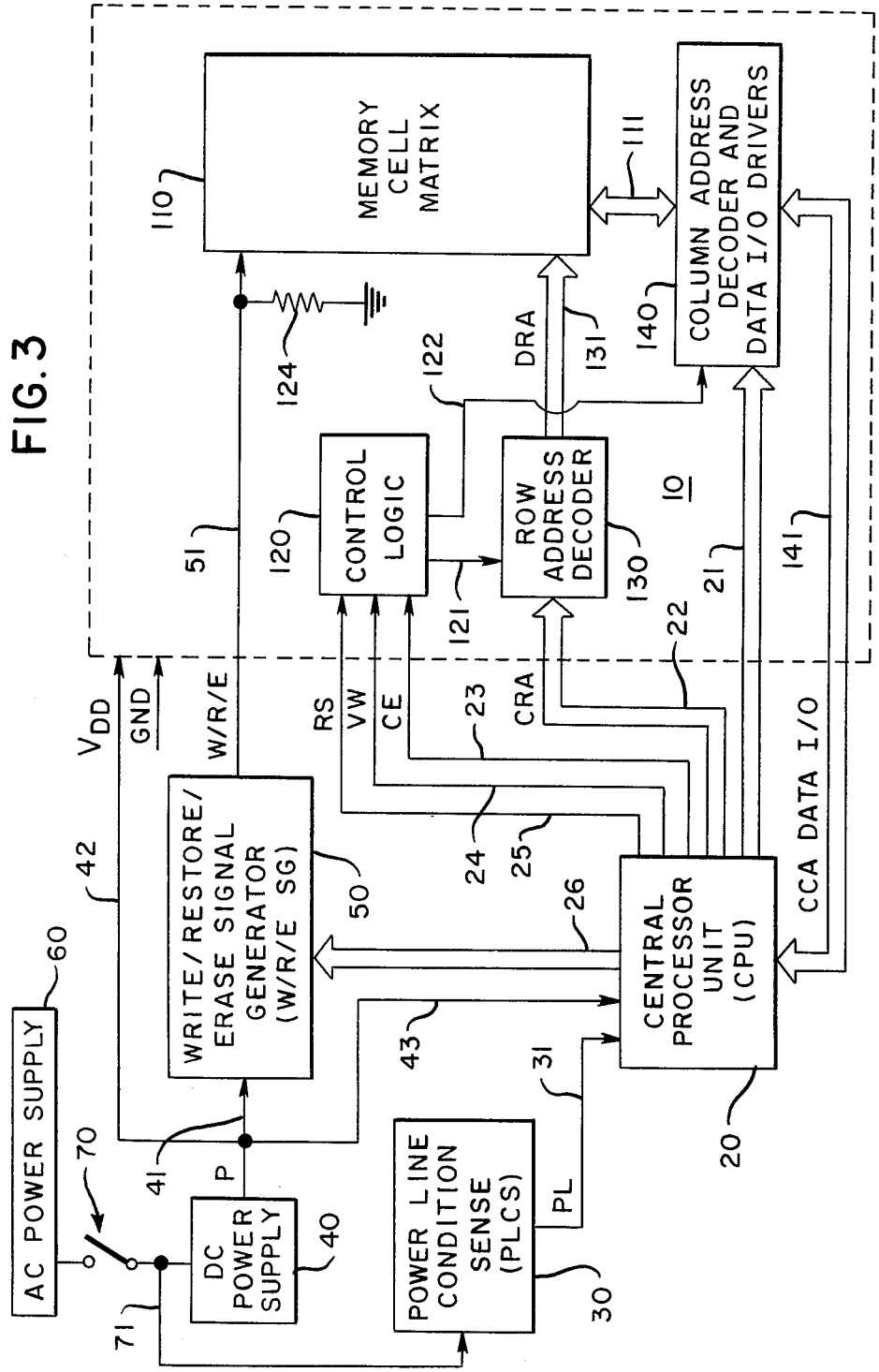
FIG. 3 is a block schematic diagram of a V/NV RAM system utilizing a V/NV RAM cell in an exemplary data processing system environment.

Referring now to FIG. 3, a typical V/NV RAM system incorporating V/NV RAM cell 400 in accordance with this invention will be described, and its use in an exemplary data processing system environment will be briefly discussed. The major elements of such a data processing system environment are a VOLATILE/NON-VOLATILE STATIC RAM SYSTEM (V/NV RAM) 10, a CENTRAL PROCESSOR UNIT (CPU) 20, a POWER LINE CONDITION SENSE CIRCUIT (PLCS), 30, a DC POWER SUPPLY 40, a WRITE/RESTORE/ERASE SIGNAL GENERATOR AND CONTROL CIRCUIT (W/R/E SG) 50 and an AC POWER SUPPLY 60.

V/NV RAM 10 includes a MEMORY CELL MATRIX 110, typically incorporating a plurality of rows and columns of volatile/non-volatile RAM cells 400 depicted in FIG. 2. V/NV RAM 10 further includes CONTROL LOGIC 120, ROW ADDRESS DECODER 130, and COLUMN ADDRESS DECODER AND DATA I/O DRIVERS 140. CONTROL LOGIC 120 provides a number of important control functions during both volatile write/read operations on memory cell matrix 110 and V/NV write, NV/V restore, and erase operations thereon. The various functions of CONTROL LOGIC 120 will be more apparent from the detailed description of these various operating modes given below. V/NV RAM 10 includes a resistor 124 connecting W/R/E line 51 to ground reference voltage. AC POWER SUPPLY 60 is typically a central power station of a utility supplying AC line voltage at an outlet to which a data processing system is connected. Switch 70 represents one or all of a main power switch on the data processing system, a circuit breaker on the system, and a circuit breaker in a central breaker box at the installation. PLSC unit 30 is connected via line 71 to the system side of switch 70 so that it can sense the loss of AC power to DC POWER SUPPLY 40 regardless of the cause. PLCS unit 30 provides an output signal on line 31 to CPU 20 indicating the presence or absence of AC power to DC POWER SUPPLY 40. Various approaches can be implemented in PLCS unit 30. In a commercially-available non-volatile retail terminal made by NCR Corporation of Dayton, Ohio, the PLCS unit examines consecutive cycles of AC signal on the power line and signals the CPU that power is on except when it detects that preselected number of consecutive cycles are missing, at which time it signals the CPU that power is off. This approach is readily implemented in straightforward analog and digital circuits.

DC POWER SUPPLY 40 may generally be any typical power supply capable of supplying sufficient current at a five volt level to the various operating portions of the data processing system. The only special characteristic required for DC POWER SUPPLY 40 is that it be capable of continuing to supply DC voltage at about the five volt level to the system after loss of AC power, so that the CPU and other portions of the system can function for the time required to respond to the power-down condition. In particular, the DC supply to V/NV RAM system 10 must continue for sufficient time for the system to execute a V/NV write operation before power to V/NV RAM system 10 is lost. Prior supplies having such characteristics are available in the prior art and generally it is sufficient for such power supplies to store the five volt signal on a large enough capacitor to retain the signal for about fifty milliseconds after interruption of AC power.

W/R/E SG unit 50 may be the unit disclosed in Lockwood patent appliction Ser. No. 020,123, filed Mar. 13, 1979. This unit functions to provide a write voltage signal to V/NV RAM 10 on line 51 under control of CPU 20 via a signal on bus 26 during a V/NV write operation. It also functions to provide an erase signal under the control of CPU 20 after an NV/V restore operation has been performed on V/NV RAM 10. If V/NV RAM 10 is to be restored in a non-inverted fashion, it also provides the restore signal required prior to erase.

Operation of V/NV RAM system 10 in exemplary sequence of V/NV write, NV/V restore, and erase operations will now be described in conjunction with FIGS. 2, 3, and 4. As previously noted, each cell in MEMORY CELL MATRIX 110 is a cell 400 as shown in FIG. 2. The sequence of operations simultaneously effects operations in each cell, but it will be sufficient to consider only one cell because the operation on each is essentially identical. For purposes of this discussion, it will be assumed that the non-alterable sections 407A and 408A of non-volatile capacitors 407 and 408 are constructed with a depletion mode threshold and that the NV/V restore operation is an inverted restore produced by applying a ground reference potential to the gate electrodes of non-volatile capacitors 407 and 408. If non-alterable sections 407A and 408A are constructed with an enhancement mode threshold then a positive reference potential is applied to the gate electrodes of capacitors 407 and 408 during the restore operation.

Figure 4:
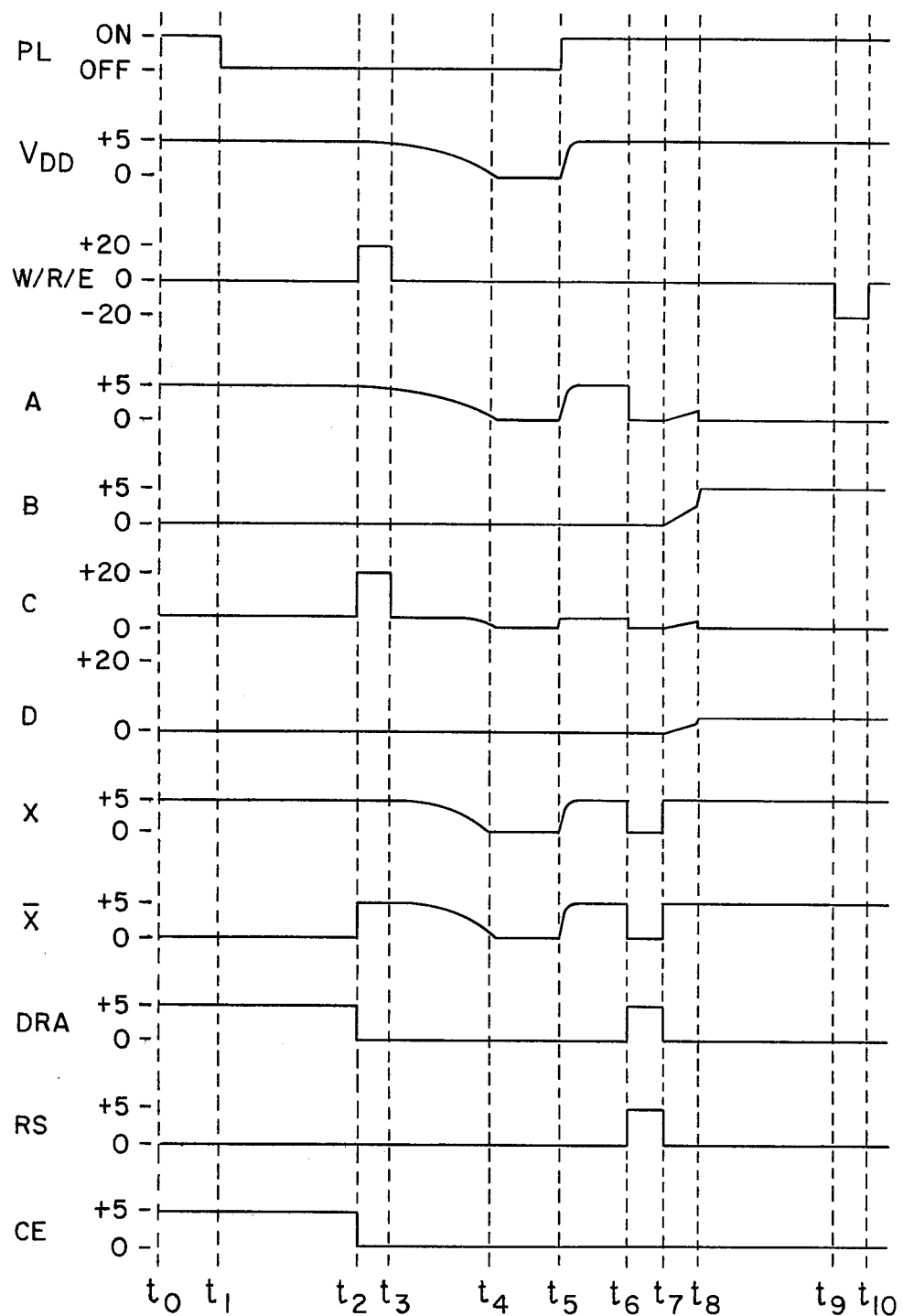
FIG. 4 is an operating signal diagram depicting a preferred operating mode of the V/NV RAM cell illustrated in FIG. 2 as incorporated in a system environment exemplified in FIG. 3.

FIG. 4 shows the signals appearing on various leads and terminals of the system of FIG. 3 and an exemplary memory cell 400 shown in FIG. 2 at various times in an exemplary sequence of V/NV write, NV/V restore and erase operations. Consider the status of the system prior to time $t_1$ shown in FIG. 4. During the interval from $t_0$ to $t_1$, AC POWER SUPPLY 60 is effectively coupled to and supplying power to DC POWER SUPPLY 40. Accordingly, PLCS 30 outputs a signal PL on line 31 indicating a power-on state of CPU 20. DC POWER SUPPLY 40 accordingly is providing a positive five volt DC signal output during this interval. This five volt signal is supplied via line 41 to W/R/E SG unit 50, to V/NV RAM 10 (via line 42) and to CPU 20 (via line 43). Thus, during the interval from $t_0$ to $t_1$, the system is functioning in a normal power-on manner and CPU 20 can perform normal volatile read or write operations on V/NV RAM 10.

As shown in FIG. 4, during the $t_0$ to $t_1$ interval both the chip enable (CE) signal on line 23 and an exemplary decoded row address (DRA) signal (e.g. on line 131A, FIG. 2) are high. For purposes of illustration, it will be assumed that the system is in the process of performing a data read operation on at least one of the cells in the row associated with the DRA signal. Volatile write (VW) signal from CPU 20 on line 24 (not shown) is low as is reset signal (RS) on line 25 from CPU 20. It will further be assumed that the exemplary cell being discussed is in its volatile 1 state such that terminal A of the cell has a positive voltage thereon while terminal B has ground reference voltage thereon. Since the DRA signal is high, access transistors 403 and 404 in cell 400 are on and complementary column data lines X and $\overline{X}$ have thereon substantially the same voltage as output terminals A and B. V/NV RAM 10 presents this information on the volatile 1 state of cell 400 to CPU 20 via one of 25 DATA I/O lines 141.

Shortly before time $t_1$ the supply of AC power to DC POWER SUPPLY 40 is cut off, for example, due to an electrical storm knocking out a power transformer on a nearby power pole. Accordingly, at time $t_1$ PLCS 30 has verified the power loss and signals that condition to CPU 20 on the PL line. At this time the power supply signal P ($V_{DD}$ in RAM 10) output from DC POWER SUPPLY 40 begins slowly to decline. However, due to the design of the power supply, it remains at very near a five volt level for at least fifty milliseconds. During the interval between $t_1$ and $t_2$, CPU 20 will have recognized the power failure due to the PL signal and will, if necessary, take a short time to complete its execution of certain machine operations in preparation for performing a V/NV write operation. For example, CPU 20 may want to dump certain information into memory cell matrix 110 so that it can later determine the last machine operation which it performed prior to executing the V/NV write operation.

At time $t_2$ CPU 20 will begin to execute a subroutine, which may be stored in ROM program memory (not shown), to provide the V/NV write operation. At time $t_2$ CE goes low so that information will not be changed in memory cell matrix 110 during the V/NV write operation. Accordingly, DRA goes low and access transistors 403 and 404 are turned off. X stays high and $\overline{X}$ goes high. CPU 20 signals W/R/E SG 50 to produce a non-volatile write signal (e.g. 20 volts positive of about 10 milliseconds duration) on W/R/E line 51 which is coupled to W/R/E line 51A in cell 400. As shown at time $t_2$ this positive write signal causes the voltage on node C to bootstrap up to a level of about fifteen volts positive. During the interval of the write pulse between $t_2$ and $t_3$, the bootstrapped voltage on node C is coupled to the channel of non-volatile capacitor 407 in cell 400 to provide channel-shielding for the threshold alterable section 407B therein. Simultaneously, the positive write signal on line 51A in cell 400 is furnished to gate electrode 408C of non-volatile capacitor 408 to cause alterable threshold section 408B to be written into its written threshold state of about six volts positive. At time $t_3$, the V/NV write operation has been completed, and the volatile 1 state of cell 400 has been transformed into a non-volatile 1 state in cell 400. It should be understood that this V/NV write operation is simultaneously performed on each cell in memory matrix 110 such that each cell having a volatile 1 state is written to a non-volatile 1 state and each cell in a volatile 0 state is written to non-volatile 0 state.

Between time $t_3$ and $t_4$, signal P from DC POWER SUPPLY 40 continues to degrade toward zero volts. The power signal $V_{DD}$ supplied to each cell in RP line 123 also degrades to zero volts during this interval. Between $t_4$ and $t_5$ the power is off. In a typical power failure situation, the power may be off for anywhere from just a few seconds to several hours or more. Where the system has purposely been shot down, by turning it off at night, for example, the power may be off for a number of hours or even over a weekend. The length of the power off condition is inconsequential since V/NV RAM 10 is capable of retaining the stored non-volatile information for at least thirty days.

At time $t_5$, AC power is restored to the system and a signal as to that restoration is sent on line PL to CPU 20. At this point, power from DC POWER SUPPLY 40 is rapidly recovered as shown by the rise of the $V_{DD}$ signal to the five volt level. Simultaneously, the voltages on X and $\overline{X}$ rise to five volts. For purposes of illustration, it will be assumed that the inherent capacitive imbalance in cell 400 causes the cell to assume a volatile 1 state, indicated by output terminal A having a positive signal thereon with output terminal B at ground reference voltage.

At time $t_6$ the NV/V restore operation begins as CPU 20 turns RS on line 25 high. Control logic 120 responds to this reset signal by turning on all DRA lines to memory cell matrix 110 and placing ground reference voltages on all complementary column data lines X and $\overline{X}$ associated with each column of the memory cell matrix 110. This completely resets the output terminals A and B in each cell of memory cell matrix 110 to ground reference potential in preparation for a restore operation (i.e. ground reference voltage) on W/R/E line at time $t_7$. At time $t_7$ the vertical scale of voltages associated with the two signal lines designated A and B, is changed in order to enable the response of the circuit at output terminals A and B to the restore operation to be more clearly shown. Similarly, the time scale between $t_7$ and $t_8$ is changed in order to show the operation of the cell 400 in response to a restore signal. (It should be understood that the time scales shown in FIG. 4 are selected for illustration only and do not necessarily depict actual time scale conditions.)

At time $t_7$ after the reset pulse on line RS goes low and DRA goes low to turn off the access transistors, both output terminals A and B will begin to charge toward positive voltages. However, since a larger capacitance is coupled to output terminal A due to both non-alterable section 407A and alterable section 407B being turned on by the ground voltage signal provided on W/R/E line, output terminal A will charge toward a positive voltage much more slowly than output terminal B. Accordingly, the voltage at output terminal B will reach the threshold voltage of switching transistor 401 before the voltage on output terminal A reaches the threshold voltage of switching transistor 402. At time $t_8$ switching transistor 401 turns on to ground output terminal A and output terminal B rises rapidly towards its final positive voltage level.

The inverted data produced in this restore operation can be handled by CPU 20 in a number of ways. One way would be to produce a second sequence of erase V/NV write and NV/V restore operations to re-invert the data to its original value. Another straightforward approach would be to read out all of the data from each V/NV RAM chip, re-invert it and write it back into the V/NV RAM chip. A third approach would be to provide each V/NV RAM chip with a V/NV control cell which toggles each time the V/NV RAM chip is subjected to a V/NV write and NV/V restore operation sequence with the output of the control cell driving a programmable inverter with the DATA I/O DRIVERS on V/NV RAM chip 10. In this fashion, the data would always be presented to CPU 20 in a non-inverted manner even though it is actually restored to memory cell matrix 110 in an inverted fashion.

It should be understood that any of the alternative modes of performing a NV/V restore operation set forth in the above-referenced Aneshansley and Lockwood applications could also be utilized in conjunction with this invention provided certain modifications in the cell and/or control logic 120 are made where required.

After the NV/V restore operation has been completed, CPU 20 signals W/R/E SG 50 to provide an erase signal on line 51. Accordingly, at time $t_9$ an erase signal of twenty volts negative appears on line W/R/E. This erase signal is typically about ten milliseconds in duration and returns all non-volatile capacitors in memory cell matrix 110 to their erased threshold state. At time $t_{10}$ V/RAM 10 is ready to resume normal volatile operation under the control of CPU 20.

It should be understood that V/NV RAM 10 is typically implemented on a single IC chip. To provide the necessary amount of static RAM storage capability, a typical system will employ a plurality of such IC chips. Typically, the CE signal is used to address one particular chip at a time for volatile data write and read operation. However, during the V/NV write, NV/V restore, and erase operations, all V/NV RAM chips in the system are provided simultaneously with the write, restore, and erase signals.

The above description of a preferred embodiment of this invention and preferred modes of operation thereof are given by way of example only. Numerous modifications could be made by persons of ordinary skill in the art without departing from the spirit and scope of this invention as claimed in the claims set forth below. For example, it would also be possible to use RAM cell 400 shown in FIG. 1B in a power-up initializing mode in which data is maintained continuously in the non-volatile capacitors 407 and 408. This initializing data is refreshed to the cell after each power-down operation to initialize the V/NV RAM to a predetermined arrangement of data bits regardless of the arrangement of data bits therein at the time power is lost. In this mode of operation, a V/NV write operation would not be performed on the V/NV RAM 10. An erase operation would not be performed unless and until it was desired to alter the initializing data bit pattern stored in the non-volatile capacitors in each cell. It should also be apparent that each cell could be provided with an additional set of non-volatile capacitors with the first set used to store initializing data bit patterns and the second set used to store actual data bit patterns existing in memory cell matrix 110 at the time a power-down condition occurs. Separate control lines would be provided to each pair of non-volatile capacitors in each cell so that the CPU could selectively perform an NV/V restore operation to initialize the cells to the bit pattern continuously stored in the first set of non-volatile capacitors or to return the cells to the prepower-down bit pattern stored in the second set of non-volatile capacitors during a previous V/NV write operation.

In FIG. 4, a power-down/power-up sequence is shown in which a V/NV write operation only is performed on power-down and an erase operation is performed on power-up after a NV/V restore operation. In systems that are left on for many days, it is preferable that the power-down sequence involve first an erase operation quickly followed by a V/NV write operation. This will avoid a possible marginal differential threshold state in the non-volatile capacitors after a V/NV write operation which could occur if the erased state threshold has degraded with time as tends to happen in n-channel non-volatile capacitor structures. This may be of particular importance in the inverted restore operation described above in conjunction with FIG. 4 since that operation relies on one of the alterable sections of the non-volatile capacitors having a depletion threshold level to produce the capacitive imbalance required by accurate restoration of data to the RAM cell.

We claim:

1. A memory cell having both volatile and non-volatile binary data storage capability comprising a bistable multivibrator having selectable first and second stable, volatile operating states and including a pair of output terminals having voltages thereon representing the operating state thereof and a pair of non-volatile, threshold-alterable capacitors each coupled to an associated one of said output terminals with its gate electrode independent of said associated output terminal and adapted to receive write, restore and erase voltage signals, said multivibrator being constructed with low supply voltage, n-channel SIS device technology and further comprising a pair of field effect transistor of a depletion or enhancement type each coupled between one of said non-volatile capacitors and an associated output terminal to form a pair of nodes therebetween, the gates of said transistors being adapted to receive a prearranged bias voltage such that, upon receipt by said gate electrodes of said non-volatile capacitors of a write voltage signal at least several times greater in magnitude than said supply voltage, the voltage on one of said pair of nodes bootstraps to a magnitude substantially greater than said supply voltage, thereby providing effective channel shielding in the associated non-violatile capacitor while isolating said bootstrapped voltage from said output nodes.

2. A memory cell according to claim 1, wherein said low supply voltage is substantially five volts, said write voltage signal is substantially twenty volts, said field effect transistors coupled between said non-volatile capacitors and said output terminals are depletion type transistors and said prearranged bias voltage on the gates of said depletion transistors is substantially ground reference voltage, whereby said bootstrapped voltage on said one of said pair of nodes comprises substantially fifteen volts.

3. A memory cell according to claim 1, wherein said low supply voltage is substantially five volts, said write voltage signal is substantially twenty volts, said field effect transistors coupled between said non-volatile capacitors and said output terminals comprise enhancement type transistors, and said prearranged bias voltage on said enhancement type transistors is substantially said five volt supply voltage, whereby said bootstrapped voltage on said one of said pair of nodes comprises substantially fifteen volts.

4. A memory cell having both volatile and non-volatile binary data storage capability comprising a multivibrator having selectable first and second stable, volatile operating states and including a pair of output terminals having voltages thereon representing the operating state thereof, said multivibrator comprising a pair of n-channel, SIS field effect switching transistors having source and drain terminals connected respectively to said output terminals and a common reference voltage terminal with the gates of said switching transistors cross-coupled to the opposite output terminal, and a load impedance means coupled between each output terminal and a power supply bus, said transistors and said load impedance means adapted to operate from a supply voltage on said bus of substantially 5 volts or less; a non-volatile, threshold-alterable capacitor coupled to each of said output terminals through an associated field effect transistor of a depletion or enhancement type defining a pair of nodes at the junctions of said non-volatile capacitors and said field effect transistors, the gate electrodes of said non-volatile capacitors being independent of said output terminals and adapted to receive write, restore, and erase voltage signals for controlling, respectively, the writing of volatile operating state information in said multivibrator into said non-volatile capacitors, the restoring to said multivibrator of said information into said non-volatile capacitors, and the erasing of said non-volatile capacitors, the gates of said coupling field effect transistors being adapted to receive a prearranged bias voltage such that, upon receipt by said gate electrodes of said non-volatile capacitors of said write voltage signal having a magnitude at least several times greater than said supply voltage, the voltage on one of said pair of nodes bootstraps to a magnitude substantially greater than said supply voltage, thereby providing effective channel shielding in the associated non-volatile capacitor while isolating said bootstrapped voltage from said output terminals.

5. A memory cell according to claim 4, wherein said low supply voltage is substantially five volts, said write voltage signal is substantially twenty volts, said field effect transistors coupled between said non-volatile capacitors and said output terminals are depletion type transistors and said prearranged bias voltage on the gates of said depletion transistors is substantially ground voltage, whereby said bootstrapped voltage on said one of said second pair of nodes comprises substantially fifteen volts.

6. A memory cell according to claim 4, wherein said low supply voltage is substantially five volts, said write voltage signal is substantially twenty volts, said field effect transistors coupled between said non-volatile capacitors and said output terminals comprise enhancement type transistors, and said prearranged bias voltage on said enhancement type transistors is substantially said five volt supply voltage, whereby said bootstrapped voltage on said one of said second pair of nodes comprises substantially fifteen volts.

* * * * *